United States Patent [19]
Bullock et al.

[11] Patent Number: 5,229,713
[45] Date of Patent: Jul. 20, 1993

[54] METHOD FOR DETERMINING ELECTRICAL ENERGY CONSUMPTION

[75] Inventors: Donald F. Bullock, Madbury; Samuel G. Hardy, New Durham, both of N.H.

[73] Assignee: General Electric Company, Schenectady, N.Y.

[21] Appl. No.: 691,252

[22] Filed: Apr. 25, 1991

[51] Int. Cl.⁵ .................. G01R 21/06; G01R 21/133
[52] U.S. Cl. ................................. 324/142; 324/141; 364/483
[58] Field of Search ................. 324/142, 141, 103 R, 324/107; 364/483

[56] References Cited

U.S. PATENT DOCUMENTS

| | | |
|---|---|---|
| 2,610,789 | 9/1952 | Hales . |
| 3,024,416 | 3/1962 | Becker . |
| 3,505,505 | 4/1970 | Byerly et al. . |
| 3,505,506 | 4/1970 | Kostalos, Jr. . |
| 3,748,440 | 7/1973 | Alexander . |
| 3,829,671 | 8/1974 | Gathright et al. . |
| 3,858,036 | 12/1974 | Lunsford . |
| 3,917,935 | 11/1975 | Lazecki . |
| 3,939,330 | 2/1976 | Fluet . |
| 4,077,061 | 2/1978 | Johnston et al. . |
| 4,131,847 | 12/1978 | Kohga et al. . |
| 4,174,499 | 11/1979 | Waurick . |
| 4,257,004 | 3/1981 | Miller . |
| 4,298,942 | 11/1981 | Lee . |
| 4,300,182 | 11/1981 | Schweitzer, III . |
| 4,408,283 | 10/1983 | Kovalchik et al. . |
| 4,454,471 | 6/1984 | Schwendtner et al. . |
| 4,553,260 | 11/1985 | Belt et al. . |
| 4,595,988 | 6/1986 | Chiffert et al. . |
| 4,615,009 | 9/1986 | Battocletti et al. . |
| 4,663,587 | 5/1987 | Mackenzie . |
| 4,672,555 | 6/1987 | Hart et al. ................... 324/142 |
| 4,694,417 | 9/1987 | Cantwell . |
| 4,749,941 | 6/1988 | Halder et al. ................. 324/142 |
| 4,794,369 | 12/1988 | Haferd . |
| 4,837,504 | 6/1989 | Baer et al. . |
| 4,853,620 | 8/1989 | Halder et al. ................. 324/142 |

(List continued on next page.)

FOREIGN PATENT DOCUMENTS 929664 7/1973 Canada .
392494 12/1973 U.S.S.R. .
404082 3/1974 U.S.S.R. .

(List continued on next page.)

OTHER PUBLICATIONS

Bullock, An Algorithm For Calculating kVAh, General Electric Company, Meter & Control, Somersworth, N.H. 03878 (to be published).

(List continued on next page.)

Primary Examiner—Ernest F. Karlsen
Attorney, Agent, or Firm—Bell, Seltzer, Park & Gibson

[57] ABSTRACT

A method of operating a meter to perform the steps of generating a measure of real energy consumed, generating a measure of reactive energy consumed, and generating, from the real energy and reactive energy measures, a measure of apparent energy consumed. In one embodiment, the real energy and reactive energy measures are provided as integer quantity inputs. Particularly, assume S=kVAh, P=kWh, Q=kVARh, and R=Residue. Respective registers store values of P, $[2P+1]$, Q, $[2Q+1]$, and the sum $[P^2+Q^2]$. Initially, the P, Q, and $[P^2+Q^2]$ registers are set to zero, while the $[2P+1]$ and $[2Q+1]$ registers are initialized to 1. At the arrival of a P pulse, the value in the $[2P+1]$ register is added to the $[P^2+Q^2]$ register, then the P register is incremented by 1 and the $[2P+1]$ register is incremented by 2. Exactly the same steps are carried out subsequent to receipt of a Q pulse. A set of registers also is used to store the S and $[2S+1]$ data, and generation of the S pulses is determined as follows. After arrival of either a P or Q pulse, a trial subtraction of $[2S+1]$ is made from the $[P^2+Q^2]$ register. If the subtraction does not cause an underflow, an S pulse is generated, the S register is incremented by 1, and the $[2S+1]$ register is incremented by 2. If the subtraction causes an underflow, the $[P^2+Q^2]$ register is reset to its previous value, the other registers are not incremented, and no S pulse is generated.

34 Claims, 4 Drawing Sheets

U.S. PATENT DOCUMENTS

| | | | |
|---|---|---|---|
| 4,881,027 | 11/1989 | Joder et al. | 324/142 |
| 4,884,021 | 11/1989 | Hammond et al. | |
| 4,902,965 | 2/1990 | Bodrug et al. | |
| 4,931,725 | 6/1990 | Hutt et al. | 324/142 |
| 4,937,520 | 6/1990 | Arseneau et al. | 324/141 |
| 4,979,122 | 12/1990 | Davis et al. | |
| 5,122,735 | 6/1992 | Porter et al. | |
| 5,146,157 | 9/1992 | Clark et al. | |

FOREIGN PATENT DOCUMENTS

| | | |
|---|---|---|
| 627477 | 10/1978 | U.S.S.R. |
| 646330 | 2/1979 | U.S.S.R. |
| 752332 | 7/1980 | U.S.S.R. |
| 1129610 | 12/1984 | U.S.S.R. |
| 1451614 | 1/1989 | U.S.S.R. |
| 2117913A | 10/1983 | United Kingdom |

U.S. PATENT DOCUMENTS

Bullock, Solid State Meter Technology, North Carolina Meter School, Wilmington, N.C., Jun. 20, 1990.

Chpt. 9, Kilovar and Kilovolt-Ampere Metering, Handbook For Electricity Metering, Eight Edition, Edison Electric Institute, 1981, 1111 19th Street, N.W., Washington, D.C. 20036.

Electric Power Metering, McGraw-Hill Book Company, Inc., 1934 pp. 271-272.

Electric Meter History and Progress, Sangamo Electric Company, Springfield Ill., 1025 p. 60.

European Search Report, Application No. 92303673 (and cited documents).

Sangamo Energy Management Division, Product Bulletin 10506, ST-Q100 Series, Electronic Meter, Effective Date Jun., 1987.

Sangamo Energy Management Division, Product Bulletin 10251, ST-Q120 Series, Electronic Meter, Effective Date Aug., 1987.

Sangamo Electricity Division, KV1 Multifunction Meter, Product Bulletin 10532, Effective Sep., 1989.

Scientific Columbus, JEM3, Sep. 1989.

Applachian Technologies Corporation, SSM-SOT Four Quadrant, Time-of-Use Precision Meter, Oct. 1989.

Aptech, Inc., PFM-800 Series Multifunction Meters, Jan. 1991.

Process Systems Incorporated, The Quad 4 Solid State Meter Family, May 1991.

Trans Data, EMS 7000 Electronic Metering System with Demand Register, Publication Date Unknown, this copy obtained on May 14, 1991.

Trans Data, Inc. EMS 96 Electronic Metering System, Publication Date Unknown, this copy obtained on May 14, 1991.

ABB Type E1R Polyphase Solid-State Watthour/Varhour Meter, Sep. 1991.

Schlumberger Industries, Inc. Introducing Fulcrum Commercial/Industrial Meters, Mar. 1991.

Transmission & Distribution, May 1992, Universal Meter Introduced by ABB.

Engineering presentation to AIEC/EEI Meter and Service Committees, G.E. Meter and Control (Sep. 24, 1990) pp. 1-6.

Alexander, Square Root Routine, IBM Technical Disclosure Bulletin, vol. 20, No. 3, Aug., 1977.

Molar et al., Replacing Square Roots By Pythagorean Sums, IBM J. Res. Devlop, Nov., 1984.

Dubrulle, A Class of Numerical Methods for the Computation of Pythagorean Sums, IBM J. Res. Develop, vol. 27, No. 6, Nov., 1984.

Hogden, Mathematics For The Million, 1940.

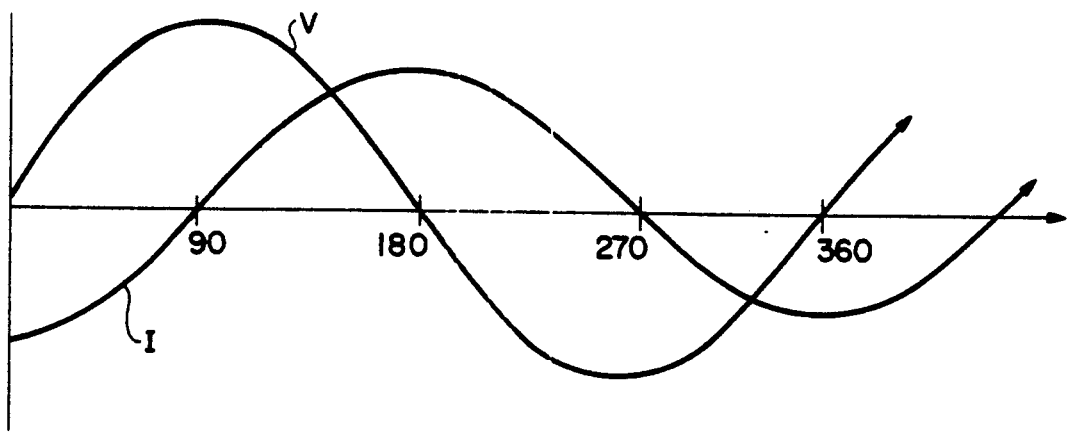
FIG. 1
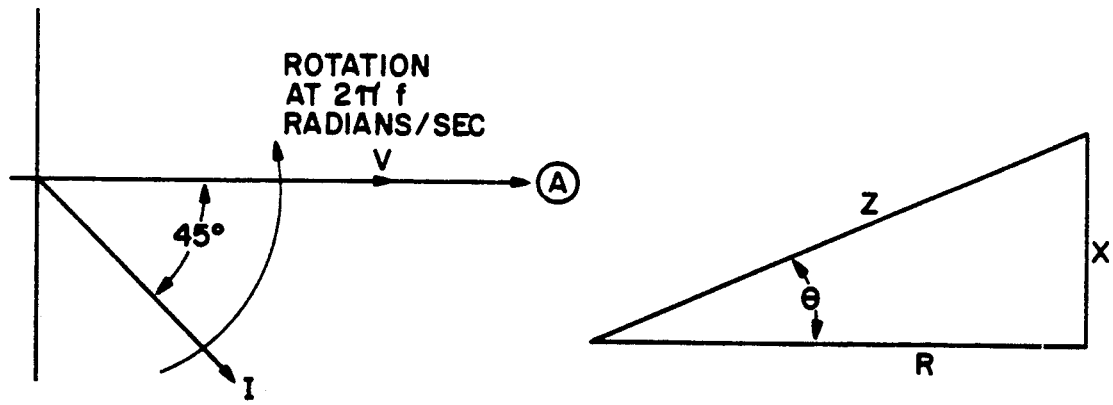
FIG. 2
FIG. 3
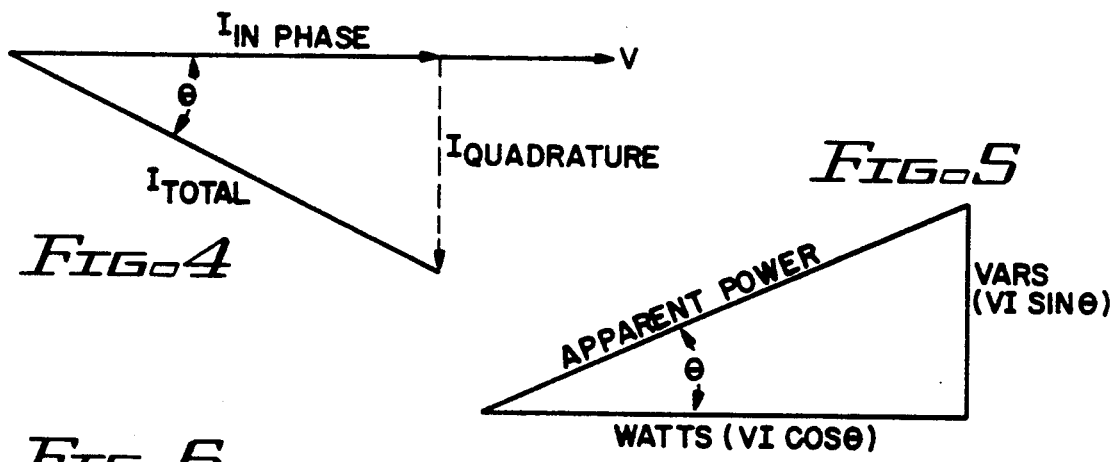
FIG. 4
FIG. 5
FIG. 6
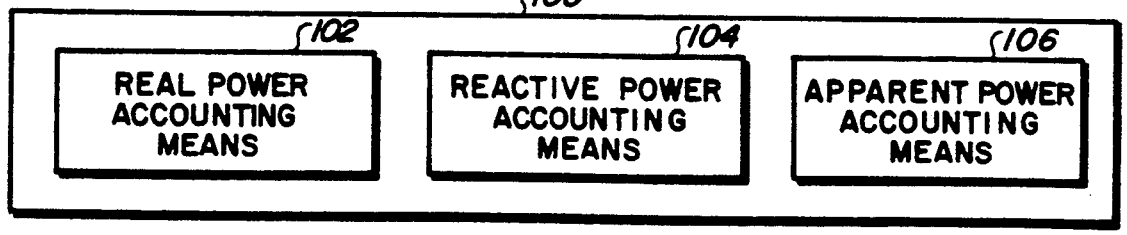

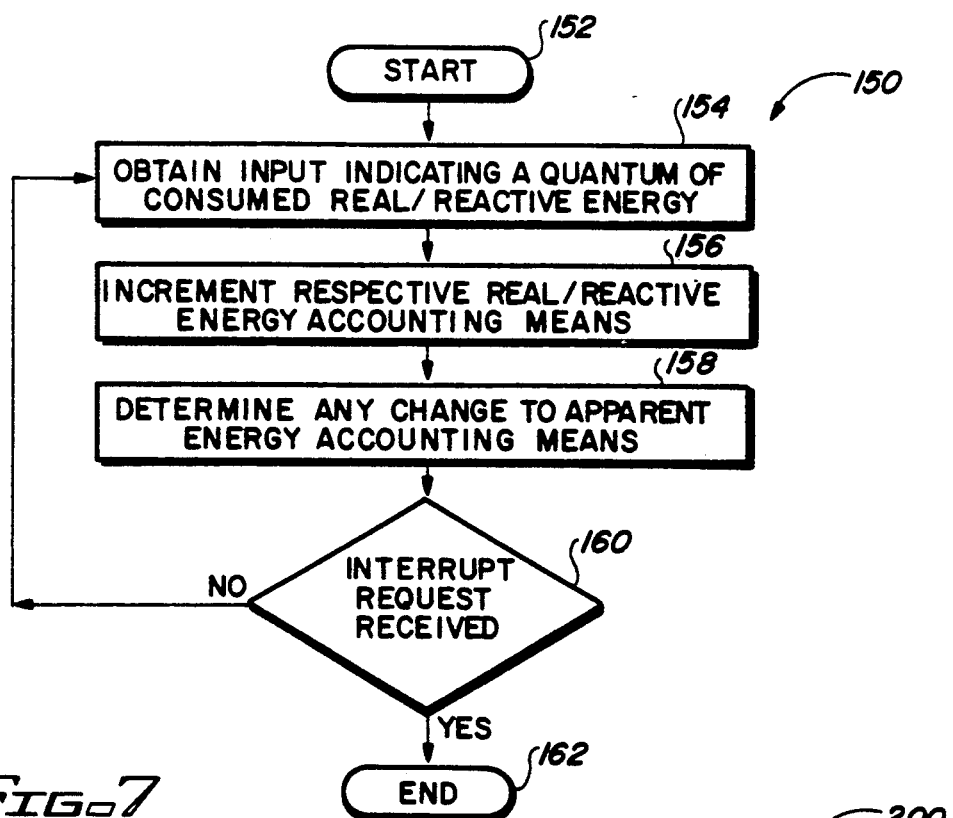
FIG-7
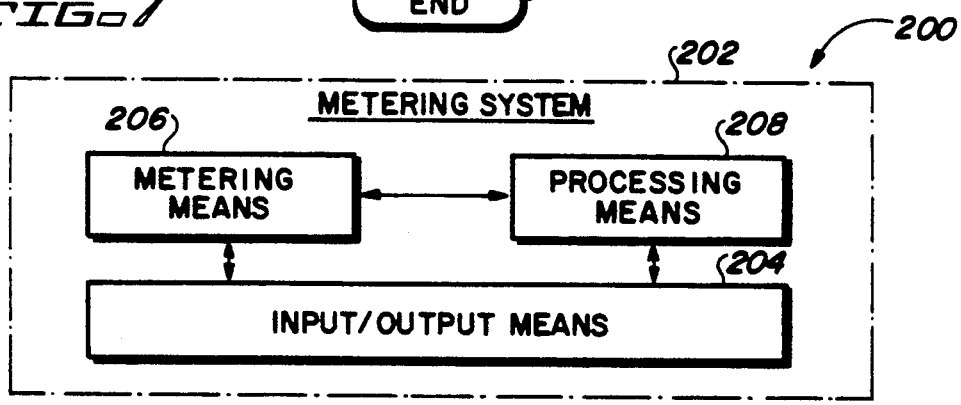
FIG-8
FIG-11
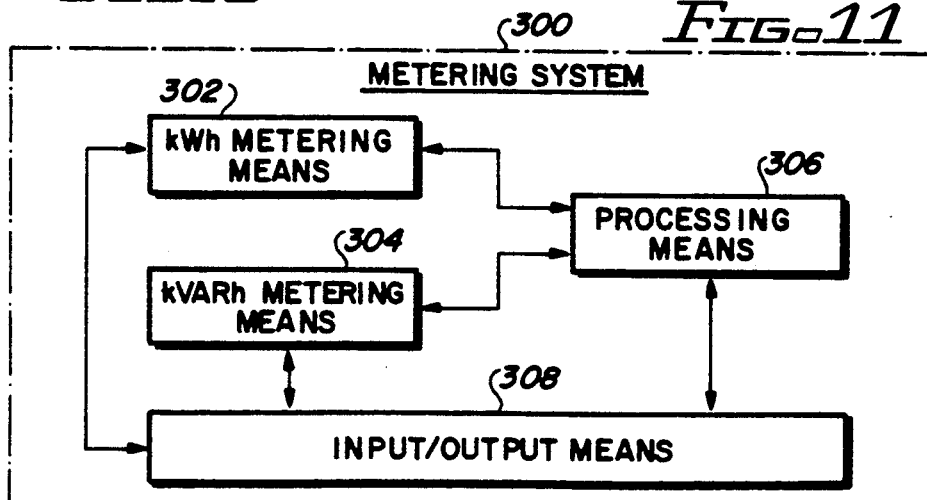

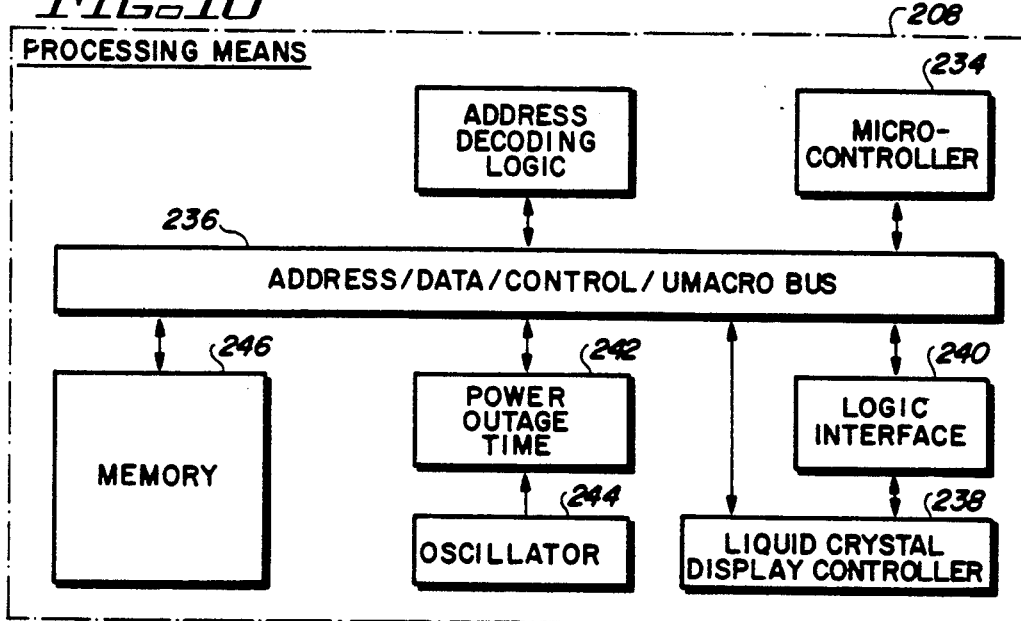
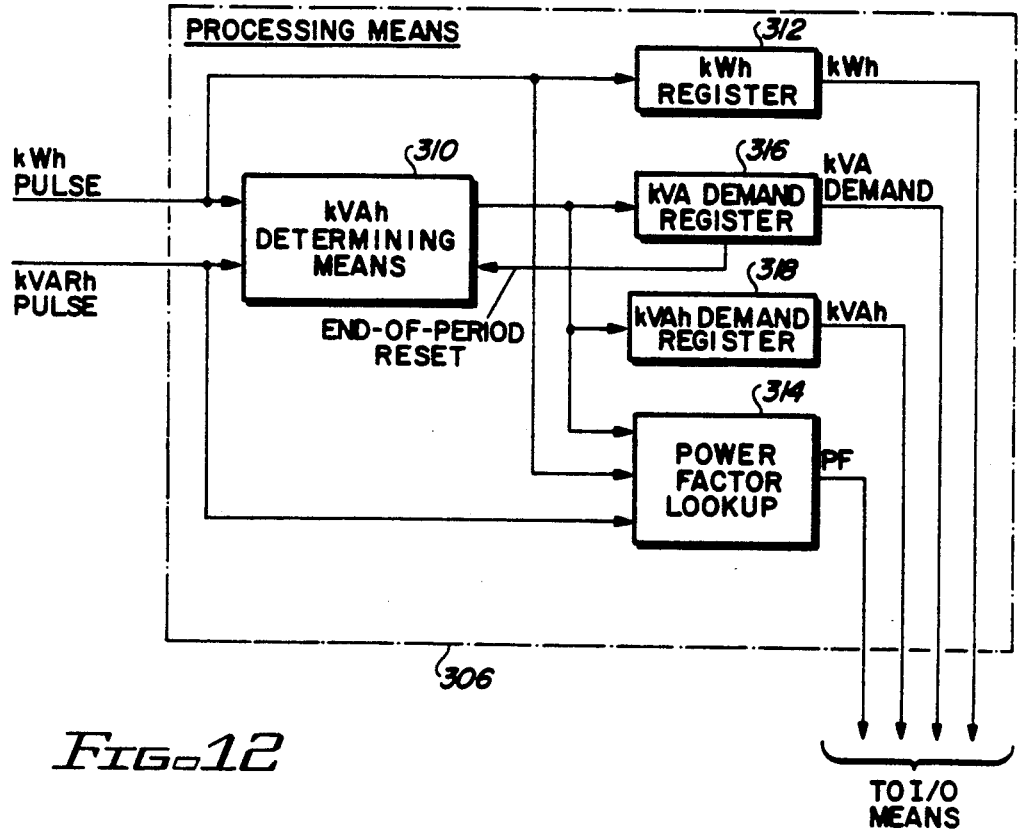

METHOD FOR DETERMINING ELECTRICAL ENERGY CONSUMPTION

BACKGROUND OF THE INVENTION

1. Field of the Invention

The present invention generally relates to measurement of the cost of providing electric service, and more particularly, relates to accurate measurement of power consumption related quantities.

2. Related Art

The ultimate goal in the art of metering is to precisely identify the cost of providing electric service. Early meters have undergone many changes and improvements over time, all in an effort to improve further the accuracy of measurements involved in determining such cost.

Although electric utility systems are designed based on total kilovolt-amperes (kVA) required by a load to be served, real power consumed over time, or energy, is the quantity typically measured for billing a consumer. Kilovolt-amperes is referred to as apparent power. Apparent power can be visualized as being composed of two components—kilowatts (kW) and kilovars (kVAR). Kilowatts sometimes is referred to as "real power" and kilovars sometimes is referred to as "reactive power".

To better understand the difference between real power and reactive power, consider an induction motor (a typical load in an electric utility system). In order to operate the motor, two current components may be considered-magnetizing (reactive) current and power-producing (real) current. The magnetizing current is the current required to produce the magnetic fields necessary for the operation of the motor. Without magnetizing current, energy would not flow through the core of a transformer or across an air gap. The product of magnetizing current and voltage is reactive power. The power-producing current is the current which is converted into useful work performed by the motor. The product of power-producing current and voltage is real power.

Although both real and reactive power are required from an electric utility system, it was recognized as early as 1892 that real power by itself reasonably represents the cost of providing electric service. Since measurement of the real power is a long-accepted and reliable quantity in determining the cost of providing electric service, any additional improvements to determining such cost should not only be significant, but also cost effective. Before now, the conflicting goals of keeping meter costs down but also providing a meaningful reactive power measurement prevented widespread use, especially for residential services, of reactive power measurements.

With regard to the cost of measuring reactive power, and referring again to the induction motor example, an induction device typically introduces both an inductive (magnetizing) reactance and a resistance (real) into an electric utility system. In the presence of only a resistive load, current flowing in the system is in-phase with the voltage, i.e., no magnetizing current is required. When an inductive load is introduced into the system, however, total current flowing in the system is shifted out-of-phase with the voltage by an angle depending upon the relative amounts of resistance and reactance. Although total current flowing in the system is shifted out-of-phase with the voltage, the total current may be visualized as being composed of two components—an in-phase component and an out-of-phase, or quadrature, component.

Reactive power can be measured by a technique commonly known as phase-shifting. The phase-shifting technique requires that a meter be configured so that the applied voltage, i.e., a voltage of a magnitude representative of the magnitude of the line voltage, in the meter be displaced 90 degrees (lagging for inductive reactance) from the phase angle of the line voltage. The applied voltage, therefore, is substantially in-phase (at least in a "vector" sense) with the quadrature current component. The product of the phase-shifted applied voltage and the current thus is a measure of reactive power.

Although known phase-shifting techniques for determining reactive power are technically feasible, the known techniques have many economic disadvantages. Particularly, a reactive power measure by itself is not an accepted measure of the cost of providing electric service. A real power measure must also be provided.

Until recently, one meter could not be configured to measure both real and reactive power. Therefore, two separate meters typically are utilized—one meter to measure the reactive power and another meter to measure the real power. The added costs associated with utilizing two meters to make such measurements is highly undesirable.

Even if reactive power can be measured in some cost-effective manner, a problem hindering the cost-effective utilization of reactive power measurements is the relationship between volt-amperes (apparent power), watts (real power), and reactive volt-amperes (reactive power). More specifically, once reactive and real power measurements are obtained, these measurements must be combined in some meaningful way as a measure of electrical energy consumption. In linear sinusoidal circuits, a well-known relationship between apparent, real and reactive power is:

$$kVA = [kW^2 + kVAR^2]^{\frac{1}{2}} \qquad (1)$$

where:

kVA = kilovolts-amperes (apparent power);
kW = kilowatts (real power); and
kVAR = reactive kilovolt-amperes (reactive power).

To utilize Equation (1), a relatively sophisticated processor, compared to the processors utilized in most meters, is required. Particularly, meters typically utilize 8-bit digital processors with limited functionality and limited random-access memory. To minimize hardware costs, the processors preferably only are required to perform add/subtract and multiply/divide functions rather than the more complicated, and more computationally expensive, square/square root functions. To carry out the operations recited in Equation (1), however, a processor must be able to perform square/square root operations. The processing costs associated with carrying out Equation (1) therefore are high.

With known meter devices, in an attempt to avoid increasing the cost of a processor utilized in the reactive power meter, and instead of processing data "on-site" where it is gathered, the data is stored in a local memory device (sometimes referred to herein as a recorder) of the meter. More particularly, a pulse initiating device coupled to the meter generates a discrete pulse whenever a predetermined quantity of reactive power has been measured. Each pulse stored in the recorder therefore represents a predetermined quantum of reactive energy. The pulses are stored (e.g., on magnetic tape, solid state memory device, etc.) along with time interval pulses. A similar pulse initiating device and memory device are utilized with the real power (watthour) meter.

Once a month or so, a meter reader (typically a human) gathers the stored pulse data, e.g., a memory "dump" from the recorder memory to an electronic meter reader memory, and/or to a remote memory read by telephone, radio, or other means. The gathered pulse data is then provided to a central processing system. At the central processing site, the apparent power (kVA) for each respective time interval is determined from the real and reactive power pulses from each respective time interval. Apparent power demand (kVA demand), for example, is then determined using the following relationship:

$$\text{kVA demand} = [\text{kVAh consumed in a timed interval}]/ \quad (2)$$

[time duration of the interval]

A maximum kVA demand from a single time period is then identified. The central processor also sums the kWH pulses to obtain the total kWH energy supplied.

The utilities bill consumers for total kilowatt-hour, i.e., real power consumed during the billing period. The maximum kVA demand is used to bill a consumer for investment related costs, e.g., the cost of equipment required to furnish the consumer with electricity. Particularly, in addition to recovering for the cost of real energy consumed, a utility needs to recover the capital cost associated with the supply/distribution system. A reasonable way to recover such cost is to charge users according to the user's maximum current requirement or the user's maximum apparent power requirement. A user with a high maximum current requirement requires more capital investment by the utility (e.g., a larger transformer and lines) than a low maximum current requirement user.

Additionally, most users have lagging VAR loads due to the predominance of inductive devices such as motors, ballasts, transformers and the like connected to the system. To compensate for the inductive loads, the utility must operate its generators at a leading phase angle. Operating generators at other than zero phase angle reduces the capacity of the generators to generate real power for transmission to the load. The maximum kVA demand inherently includes a measure of the amount of leading phase angle required to compensate for each consumer's load.

With the above described and well-known system, in addition to the expense of using two meters, the meters must be equipped with respective pulse initiating devices and memory/storage devices. Further, the kVAR meter must be equipped with a phase shifting transformer. A sophisticated central data processing system operated by skilled workers also is required. The equipment cost of such a system inhibits its wide-spread application. The system typically is only used for measuring energy requirements of large revenue users.

Additionally, with the above-described system, a consumer cannot observe the status of energy consumption during a billing period and the system also does not provide real-time apparent power quantities. The above-described system provides only time-averaged quantities at the end of the billing period. Real-time information is useful, for example, so that variations in power factor can be determined during each time interval. If the power factor becomes too small (e.g., if the reactive power is large as compared to the real power) during a particular time period, the consumer may want to take steps to reduce reactive power requirements. In this manner, a consumer can attempt to minimize maximum kVA demand.

In spite of the importance of reactive power measurement, reactive power often is not measured—especially in single phase residential services. Costs associated with measuring reactive power using known systems are high. As previously explained, however, a poor ratio of kW to kVA, i.e., low power factor, has a serious effect on the economic design and operating costs of a system. When power factor is low and rates are based only on kilowatt-hours, the utility is not being compensated for the power (kVA) required to generate, transmit, and distribute.

Until now, no known meter system provides both an economically obtained measure of reactive power and an economic manner of using the reactive power measure to achieve the ultimate metering goal, i.e., accurate measurement of the cost of providing electric service. Further, no known meter system provides a relatively low cost simple manner of determining, in real-time, both real and reactive power requirements and power factor.

SUMMARY OF THE INVENTION

The present invention for determining kVAh utilizes inputs indicative of kWh and kVARh metered. These inputs typically are in the form of pulses indicative of a predetermined quantum of real/reactive energy. It should be understood, of course, that Qhour pulses rather than kVARh pulses can be utilized. From these inputs, and without performing any square/square root operation, kVAh is determined.

Particularly, and as hereinafter described in more detail, the squaring process is carried out by simple addition. For the discussion here, assume S TM kVAh, P=kWh, Q=kVARh, and R=Residue. Briefly, respective registers store values of P, [2P+1], Q, (2Q+1], and the sum of [P²+Q²]. Initially, the P, Q, and [P²+Q²] registers are set to zero, while the [2P+1] and [2Q+1] registers are initialized to 1. At the arrival of a P pulse, the value in the [2P+1] register is added to the [P²+Q²] register, then the P register is incremented by 1 and the [2P+1] register is incremented by 2. Exactly the same steps are carried out subsequent to receipt of a Q pulse.

A set of registers also is used to store the S and [2S+1] data, and generation of the S pulses is determined as follows. After arrival of either a P or Q pulse, a trial subtraction of [2S+1] is made from the [P²+Q²] register. If the subtraction does not cause an underflow, an S pulse is generated, the S register is incremented by 1, and the [2S+1] register is incremented by 2. If the subtraction causes an underflow, the [P²+Q²] register is reset to its previous value, the other registers are not incremented, and no S pulse is generated.

Using the present algorithm, a meter can be configured to measure both real and apparent power. This feature facilitates obtaining an apparent power measure and further facilitates reducing the costs of providing such a measure. By eliminating a need for determining squares/square roots, hardware costs are minimized and energy consumption determinations can be made on site in real time. A consumer therefore can observe the status of energy consumption (including power factor) and take any necessary actions.

BRIEF DESCRIPTION OF THE DRAWINGS

These and other objects of the present invention, together with further features and advantages thereof, will become apparent from the following detailed specification when read together with the accompanying drawings, in which:

FIG. 1 illustrates an example of a voltage and a current waveform in an AC circuit;

FIG. 2 is a vector representation of a waveform;

FIG. 3 illustrates the relationship between impedance, resistance, and reactance;

FIG. 4 illustrates the current component relationships;

FIG. 5 illustrates the relationship between watts, vars, and volt-amperes;

FIG. 6 is a high-level block diagram of one hardware embodiment which can be used with the present invention;

FIG. 7 is a high-level flow diagram illustrating a sequence of process steps in accordance with one embodiment of the present invention;

FIG. 8 is an embodiment of a metering system which can be utilized with the present invention;

FIG. 10 is an embodiment of processing means which can be utilized with the present invention;

FIG. 11 is another embodiment of a metering system which can be utilized with the present invention;

FIG. 12 is a more detailed block diagram of the processing means illustrated in FIG. 11.

DETAILED DESCRIPTION OF THE DRAWINGS

Figure 9:
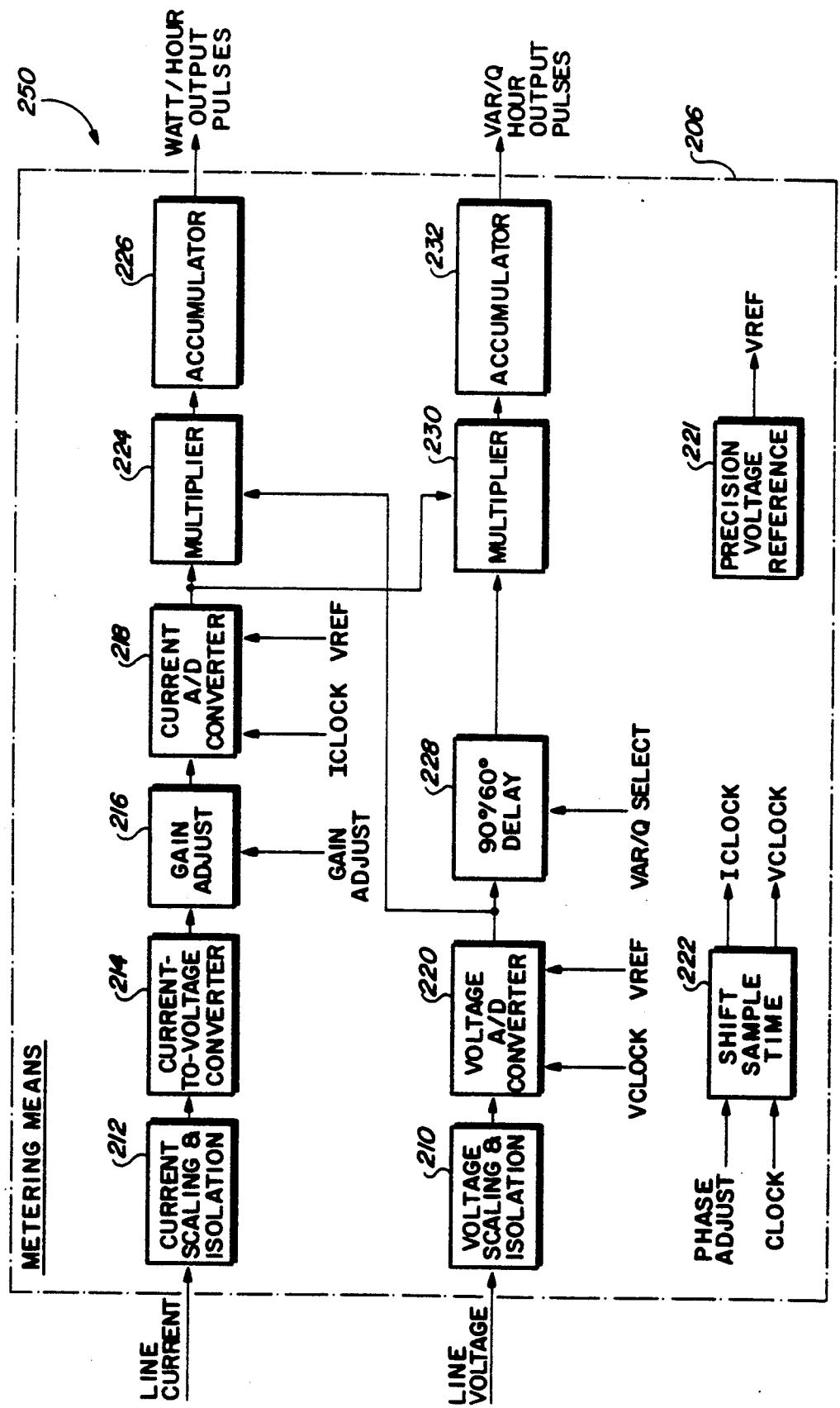
FIG. 9 is an embodiment of metering means which can be utilized with the present invention.

To facilitate ease of understanding the present invention, the following detailed description is divided in four separate sections. Section A provides some background details. Section B is an overview, Section C provides further details regarding hardware configurations, and Section D provides further detail regarding embodiments of the present algorithm.

A. Background Details

FIG. 1 illustrates an example of a sinusoidal voltage V and current I waveform in an a-c circuit, e.g., a circuit including a power generation system and a load. In the example, the current waveform (I) lags the voltage waveform (V). The term "lag" means to come later in time. When current lags the voltage, it is said to be "out-of-phase" with the voltage.

Rather than utilize fractions of a second, one cycle is said to occur in 360 electrical degrees as shown in FIG. 1. At least in the United States, the standard power transmission occurs at 60 cycles per second. 360 electrical degrees, therefore, represent 1/60th of a second. More particularly:

360 degrees = 1 cycle = 1/60th sec.;

1 degree = 1/60 × 1/360 sec. = 1/21,600 sec.; and 1 degree = 1/21,600 sec.

When referring to an amount of lag, rather than refer to a unit such as 1/21,600 sec., the quantity of "degrees" is used. This angle is called "phase angle" and is actually a measure of time by which the current lags voltage. FIG. 1 shows current lagging voltage by 90 degrees (or 1/240 sec.) or put another way, the phase angle between voltage and current is 90 degrees.

Rather than using sine waves to show phase relationship between voltage and current, phasors often are used. A phasor is used to represent a quantity which has a magnitude and a phase angle. FIG. 2 illustrates a current phasor I lagging a voltage phasor V by 45 degrees. The vectors both rotate with time, usually in a counterclockwise direction about the axis. An observer standing at point A sees the projection of the phasors and would see voltage vector V pass through zero first and then some time later would see the current vector I pass through zero.

Inductive reactance causes current to lag voltage. How great this lag (or phase angle) is depends upon both the reactance and the resistance of the circuit. The term "impedance" is a measure of both resistance and reactance. Impedance (Z) is the phasor sum of resistance (R) and reactance (X). The relationship is illustrated in FIG. 3.

The angle between the resistance (R) and the impedance (Z) phasors is equal to the phase angle. The following relationship exists between resistance, reactance and impedance:

$$\cos \theta = R/Z; \text{ and} \quad [3]$$

$$Z^2 = R^2 + X^2 \quad [4]$$

If an a-c circuit contains 20 ohms of resistance and 15 ohms of reactance, the impedance (or opposition) offered to the flow of current is 25 ohms, and the current would lag the voltage by the angle whose cosine = 20/25. The angle would be approximately 37 degrees.

Impedance also has an effect on power. Assume that the total current, $I_{TOTAL}$, is broken up into two components—an in-phase component and an out-of-phase, or quadrature, component. Solving for these two components:

$$I_{IN\ PHASE} = I_{TOTAL} \cos \theta; \text{ and} \quad [5]$$

$$I_{QUADRATURE} = I_{TOTAL} \sin \theta; \quad [6].$$

These relationships are shown in FIG. 4.

The real power in an a-c circuit is:

$$Real\ Power = Watts = VI_{IN\ PHASE} = VI \cos \theta. \quad [7]$$

In this expression, $\cos \theta$ is the power factor.

Another quantity in a-c power circuits is the reactive power or reactive volt-amperes (also referred to as VARS). Watts, vars, and apparent power are related as shown in FIG. 5. Vars equal volts (V) times the quadrature (or right-angle) current component (I sin $\theta$) of the total current.

Further information regarding well-known metering details may be found in many electricity textbooks including, for example, "Handbook For Electricity Metering", Eight Edition, Edison Electric Institute, 1981 (1111 9th Street, N.W., Washington, D.C.).

B. Overview

FIG. 6 is a high-level block diagram 100 illustrating some aspects of one embodiment of the present invention. Assume for the description here that input relating to amounts of real power and reactive power are available. The form of such inputs, e.g., pulses representative of a quantum of power, digital words, analog signals, etc., may vary and the present invention certainly is not limited by the manner or form in which such inputs are provided. Details with regard to some embodiments as to how such inputs can be provided are set forth hereinafter in Section C. It should be understood, however, that the means shown in FIG. 6 also could form part of the means for obtaining any necessary inputs, e.g., on an integrated circuit.

FIG. 6 illustrates real power accounting means 102, reactive power accounting means 104, and apparent power accounting means 106. The term "accounting means" as used herein refers to means for registering, recording, presenting, interpreting, deriving, and/or processing a quantity. The real power accounting means 102 is utilized to keep account of the amount of real power measured at the metering point. The reactive power accounting means 104 keeps account of the amount of reactive power measured at the metering point. The apparent power accounting means 106 keeps account of the amount of apparent power measured at the metering point, i.e., derived from quantities measured at the metering point. The apparent power accounting means 106 additionally accounts power factor. Although illustrated as being separate items, it should be understood that the real power accounting means 102, the reactive power accounting means 104, and the apparent power accounting means 106 could be integrated items, such as on an integrated circuit, with shared memory locations. FIG. 6 is provided only to illustrate that the present invention utilizes means, such as registers, counters, accumulators, etc., which provide and/or derive information regarding the real power, the reactive power, the power factor, and the apparent power.

FIG. 7 is high-level flow diagram 150 illustrating a sequence of process steps in accordance with one embodiment of the present invention. Particularly, subsequent to starting operations as indicated by a START legend 152, the first step 154 is to obtain input(s) indicating a quantum of metered real or reactive energy. The input may be in analog form, pulse form, digital form, etc. Once the input is obtained, then the respective real or reactive energy accounting means is incremented by an amount equal to the obtained input as indicated at 156. The term "increment" is not intended to be a limitation on the manner in which the real energy and reactive energy is accounted. For example, it is possible that a register/counter could be decremented or multiplied by some factor so as to enable an accounting of energy consumed. The only requirement is that metered energy consumed be reflected and accounted for, in some way, in the real and/or reactive energy accounting means.

Once the value of one of the respective accounting means has been changed, the next step 158 is to determine any change/update to the apparent energy accounting means which results from the change/update to the real or reactive energy accounting means. Any change to power factor also is determined. Subsequent to making the determinations, and if no interrupt request has been received as indicated at 160, operations return to the step 154 where inputs are obtained. If an interrupt request has been received, then operations stop as indicated by an END legend 162.

Although illustrated as being performed sequentially, it should be understood that some of the steps illustrated in FIG. 7 could be performed in parallel or in a distributed manner. For example, an increment operation could occur in the real and/or reactive energy accounting means while the apparent energy accounting means processes a previous increment.

In the foregoing manner, the present invention accounts for real power, reactive power, power factor, and apparent power. These quantities can then be combined in some manner and/or maintained separately to provide an output to be displayed and/or stored in an electronic memory.

C. Alternative Hardware Configurations

Many different hardware configurations may be utilized with the present invention and the present invention is not limited to any one particular hardware configuration. Therefore, although specific configurations are described herein, such configurations should in no way be construed as limitations to the present invention. Further, it should be understood that the present invention is specifically directed to a method of determining kVAh and the present invention is not directed to, for example, improved metering means, improved processing means, and/or improved input/output means.

FIG. 8 is a high-level block diagram 200 of one hardware embodiment which may be utilized with the present invention. As illustrated in FIG. 8, a meter system 202 includes input/output means 204, metering means 206, and processing means 208. Although shown in FIG. 8 as separate items, it is to be understood that the block diagram 200 is shown only to aid in developing a conceptual understanding of metering systems. For example, some of the functions which technically qualify as "metering functions" may actually be carried out in the processing means and/or in the input/output (I/O) means 204. Likewise, some processing functions may actually be carried out in the metering means 206 and/or the I/O means 204.

Typically, the I/O means 204 provides an interface between power lines (not shown) and other components of the metering system 202. The I/O means 204 also includes a display and/or memory so that the data generated by and/or stored in the other components of the meter system 202 can be provided electronically or in a human-understandable format upon request. Many alternative I/O means 204 for metering systems are well-known and commercially available.

1. Metering Means

The metering means 206 typically performs the function of generating some measurement of real energy and reactive energy. Details regarding one form of the metering means 206 preferably used with the present invention are provided in co-pending and commonly assigned U.S. patent application Ser. No. 07/412,358, filed Sep. 25, 1989, and entitled "Electronic Watthour Meter". The detailed description section of U.S. patent application Ser. No. 07/412,358 is hereby incorporated by reference. Information regarding the metering means 206 also is set forth in Bullock, Solid State Meter Technology, North Carolina Meter School, Wilmington, N.C., Jun. 20, 1990.

FIG. 9 is a block diagram description 250 of one embodiment of the metering means 206. Particularly, line current inputs and line voltage inputs are provided to the metering means 206 and watthour output pulses and VAR/Q hour output pulses are output by the metering means 206. The watthour output pulses and the VAR/Q hour pulses, respectively, are proportional to real and reactive energy consumption, respectively.

The line voltage and the line current inputs are electrically isolated and precisely scaled by respective scaling and isolation means 210 and 212 to provide secondary signals compatible with electronic circuitry. Voltage scaling to provide 1.6 Vrms at rated input voltage (120 V, for example) is suitable. Current scaling ratios of 100,000-to-one and 10,000-to-one, respectively, may be selected for self-contained (Full-scale 200 amperes) and transformer-rated (Full-scale 20 amperes) meters, respectively. Full scale secondary current from the current sensor is then 2.0 milliamps rms. A precision current-to-voltage converter 214 in the current input path converts a current signal into a voltage for compatibility with an A/D (analog-to-digital) converter. The scaling of the current-to-voltage converter is one volt output per milliamp input (1,000 ohms).

Adjustments for gain are provided by adjusting a gain stage 216 in the current path. A first A/D converter is provided for the current signal 218 and a second A/D converter 220 is provided for the voltage signal. Both A/D converters have a full-scale range of approximately +/−3.45 volts dc, as determined by VREF from a precision voltage reference 221. The precision time base (CLOCK) 222 establishes a constant sample rate at which the A/D converters simultaneously "sample" the current and voltage inputs and convert their amplitudes to binary words. Sample rates in excess of several kilohertz are required to obtain good performance for harmonics in the input signals. Phase adjustment, to precisely match the phase of the current and voltage input signals, is provided by shifting the sample time of the voltage converter relative to the current converter in small discrete steps.

To obtain output pulses proportional to watthours, each binary-coded current sample is multiplied at a multiplier 224 by its corresponding voltage sample and the product is added to an accumulator 226. Each time the accumulated sum reaches a threshold value, proportional to the meter watthour constant, an output pulse is generated. The output pulse rate has been selected to be twelve times the rate of one disk revolution for an equivalent electromechanical meter to maintain compatability with past generations of metering devices.

Output pulses proportional to varhours or Qhours are obtained in the same fashion as watthours except the voltage samples used are delayed, by a delay unit 228, a time equivalent to 90 degrees for varhours or 60 degrees for Qhours, either of which can be selected. Each binary coded current sample is multiplied at a multiplier 230 by the corresponding voltage sample and a separate accumulator 232 is used for varhour or Qhour accumulations. The same threshold as the watthour accumulator threshold is used as the varhour or Qhour thresholds. A typical threshold value is $144(10^{-6})$ volt-ampere-seconds (for a self-contained one-element meter for two-wire-single-phase applications).

For multiple phase loads, a multiplexer (not shown) can be used to extend the meter function. Separate isolation and scaling should be provided for each current and voltage input, but the remaining elements can be "time-shared". A block diagram for multiphase load circuity is set forth in the hereinbefore referenced article entitled "Solid State Meter Technology".

Accuracy is primarily limited by noise, A/D converter resolution, linearity of input scaling, linearity of the current-to-voltage converter, and linearity of the A/D converters. Stability of performance with time and temperature is limited by the stability of input scaling, stability of the current-to-voltage converter resistor, and stability of the time base and voltage reference. An apparent inaccuracy can appear at high output pulse rates combined with a few output pulses per measurement. This occurs because of the cyclic nature of power flow at twice the line frequency causing "jitter" on the output pulse rate. This can be overcome by increasing the number of output pulses per measurement.

2. Processing Means

FIG. 10 is a block diagram description of the processing means 208 which may be utilized with the present invention. The block diagram functions can be provided, for example, on a 1.2 micron CMOS application specific integrated circuit (ASIC) as is well known in the art.

The ASIC includes a microcontroller 234 coupled to an address, data, control, and umacro bus 236 (hereinafter referred to as the "bus"). A liquid crystal display controller 238 is coupled directly to the bus 236 and indirectly coupled to the bus 236 through a logic interface 240. A power outage timer 242, coupled to an oscillator 244, is coupled to the bus 236. A memory 246 including, for example, a ROM, EEPROM, and SRAM type memory blocks, also is coupled to the bus 236. The ASIC 208 also includes (but not shown) address decoding logic to define ASIC memory map, bank switching logic to extend processor address space, and communication gating logic to route register data for programming and retrieval purposes.

In operation, the microcontroller 234 performs calculating and ASIC control functions. The liquid crystal display controller 238 is utilized to control input/output means such as a liquid crystal display. The power outage timer 242, coupled to the oscillator 244, is used for timekeeping in the event of a power outage. Metering data, programs, and other information are stored in the memory 246.

3. Alternative Hardware Embodiments

FIG. 11 is another embodiment of a metering system 300 which could be used to practice the present invention. Particularly, kWh metering means 302, kVARh metering means 304, processing means 306, and input-/output means 308 are shown. The kWh metering means 302 includes a conventional kWH pulse initiator (not shown), effective in response to line voltage and load current to produce one output pulse in response to a predetermined quantity of real power consumed by a load. The kWH pulse initiator may be, for example, a conventional electromechanical meter in which a meter disk is rotated against a magnetic drag by the interaction of magnetic fluxes produced by voltage and current stators. Output pulses from the kWH pulse initiator may be produced by a conventional electromechanical or electro-optical sensor in response to a predetermined quantum of rotary motion of the meter disk.

The kWh metering means 302 may include a conventional mechanical register (not shown) for indicating the accumulated rotation of the meter disk, appropriately scaled in terms of energy consumption. Alternatively, the kWh metering means 302 may be any convenient electronic device capable of producing one output pulse in response to the consumption of any predetermined quantity of real energy required by a load.

Similarly, the kVARh metering means 304 produces an output pulse in response to a predetermined consumption of reactive energy by the load. Phase shifting, by 90 degrees, the voltage multiplied with the current provides a measure of kVAR. Such phase shifting is well known in the art. As in the case of the kWH metering means 302, the kVARh metering means 304 may also be any convenient electromechanical or electronic device capable of producing one output pulse in response to a quantity required by a load.

The processing means 306 of FIG. 11 is illustrated in more detail in FIG. 12. More particularly, the kWh pulse and the kVARh pulse outputs from the metering means 302 and 304 are provided to the processing means 306 as inputs to a kVAh determining means 310. The kWh pulse also is input to a kWh register 312 which accumulates the kWh pulses and provides the accumulated count as an output to the I/O means 308. The kVARh pulse is also provided to a Power Factor Lookup register 314. The Power Factor Lookup register 314 also receives, as input, kWh pulse and kVAh information. From the input provided, power factor can be determined as hereinafter explained. Output from the kVAh determining means 310 is provided to a kVA demand register 316 and to a kVAh register 318 which accumulates the kVAh measured. The kVA demand register 316 stores the kVA demand and also provides an end-of-period reset signal to the kVAh determining means 310.

Output from the processing means 306, as illustrated in the block diagram, includes power factor, kVAh, kVA demand, and kWh. The manner of determining these values is described in more detail in the following detailed description of the algorithm.

From the foregoing description of hardware embodiments, it should be understood that many different hardware configurations can be used with the present algorithm and the algorithm is not limited to use with any one particular hardware configuration. Further, it is also contemplated that the present algorithm could be used on a conventional personal computer (e.g., based on a Z80 microprocessor). Therefore, although the foregoing description of hardware configurations describe various hardware configurations which may be used with the present invention, such configurations are not to be construed as limitations of the present invention.

D. Algorithm

As hereinbefore described, the outputs from the metering means, i.e. kWh and kVARh, are integer quantities. Similarly, the output, kVAh, is required to be an integer quantity having the same scale factor as the inputs. To simplify an explanation of the present algorithm, the following symbols will be utilized:

S = Phasor Voltampere Hours (kVAh), sometimes referred to herein as apparent power;

P = Energy (kWh), sometimes referred to herein as real power;

Q = Quadergy (kVARh), sometimes referred to as reactive power; and

R = Residue.

The following equation, derived from equation (1), explains the relationship of the above measures:

$$S^2 + R = P^2 + Q^2 \qquad [8]$$

The integer residue R is introduced to permit equality in the equation for integer values of P, Q and S. As hereinbefore described, the metering means provides P and Q pulse outputs. These pulse outputs may be stored in respective registers. Determining kVAh, therefore, reduces to the following: given P and Q, determine S and R.

In practice, P and Q increment independently. At each increment, new values of S and/or R must be determined.

As hereinbefore explained, the microprocessor in a meter typically, and preferably, is a low cost processor and extensive code generation and computing time would be required to determine the squares and square roots of Equation 8. A simplified algorithm, therefore, is needed.

A simplified approach can be obtained by recognizing that for successive values of P and Q, e.g., $[P_n]$, $[P_{n+1}]$, etc., the following holds:

$$[P_{n+1}]^2 - [P_n]^2 = 2[P_{n+1}] - 1 = 2[P_n] + 1; \text{ and} \qquad [9]$$

$$[Q_{n+1}]^2 - [Q_n]^2 = 2[Q_{n+1}] - 1 = 2[Q_n] + 1. \qquad [10]$$

That is, the value of the square of the next integer is obtained by adding to the square of the present integer either twice the value of the next integer minus one or twice the value of the present integer plus one. Using equations (9) and (10), the squaring process can be carried out by simple addition.

The squaring algorithm can be explained mathematically by the following equation:

$$N^2 = \sum_{n=1}^{n=N} (2n - 1) \qquad [11]$$

Table 1 illustrates the values which would be assigned for increasing values for n:

TABLE 1

| n | (2n − 1) | $N^2 = \sum_{n=1}^{n=N} (2n - 1)$ |
|---|---|---|
| 1 | 1 | 1 |
| 2 | 3 | 4 |
| 3 | 5 | 9 |
| 4 | 7 | 16 |
| 5 | 9 | 25 |
| 6 | 11 | 36 |
| 7 | 13 | 49 |
| 8 | 15 | 64 |
| 9 | 17 | 81 |
| 10 | 19 | 100 |

In practice, a register stores values of P, [2P+1], Q, [2Q+1], and the sum [P²+Q²]. Initially, the P, Q, and [P²+Q²] registers are set to zero, while the [2P+1] and [2Q+1] registers are initialized to 1. At the arrival of a P pulse, the value in the [2P+1] register is added to the [P²+Q²] register, then the P register is incremented by 1 and the [2P+1] register is incremented by 2. Exactly the same steps are carried out for the Q pulse.

A set of registers also is used to store the S and [2S+1] data, and generation of the S pulses is determined as follows. After arrival of either a P or Q pulse, a trial subtraction of [2S+1] is made from the [P²+Q²] register. If the subtraction does not cause an underflow, an S pulse is generated, the S register is incremented by 1, and the [2S+1] register is incremented by 2. If the subtraction causes an underflow, the [$P^2+Q^2$] register is reset to its previous value, the other registers are not incremented, and no S pulse is generated.

Further, the sum of the squares register actually holds the value of the residue R since:

$$R = [P^2 + Q^2 - S^2]. \quad [12]$$

As the numbers continue to increase indefinitely, it is necessary to terminate the determination and start again. If the power factor varies, the algorithm provides a time average value for the kVAh and power factor.

For example, assume that an electro-mechanical meter is being used and the rotation of the kilovar-hour disk of the meter moves a paper chart in a continuous manner while the rotation of the kilowatt-hour disk moves a pen across the chart in a continuous manner. The curve or line graph drawn is a plot of kVARh against kWh. The length of the line graph represents the kVAh metered while the slope of the line at any point represents the instantaneous power factor.

If the system were not reset periodically, the pen would run-off the chart. This is analogous to a digital system creating numbers larger than it can handle. If, at the time of reset, the total kilowatt-hours and the total kilovar-hours are noted, a line could be drawn from the noted point back to the origin. The slope of this line would be the "average" power factor and the length of the line would be the "average" kVAh.

In general, this line would be shorter than the curve drawn by the pen (unless the curve is a straight line representing a constant power factor). This is analogous to the digital determination of metering pulses. The line approximation is a secant to the curve drawn by the pen. The shorter the secant line, the more closely it approaches the length and slope of the curve.

With a recorded pulse data system, the secant is as long as the number of pulses in the demand interval. Within the interval, there is no data to permit any discrete determinations. Processing the data within the meter permits the secant to be as short as desired, subject to other limitations to be described.

Determination of S and R has been described, but S is not the length of the secant. Particularly:

$$kVAh = P^2 + Q^2]^{\frac{1}{2}} = [S^2 + R]^{\frac{1}{2}} = S_c. \quad [13]$$

S is an integer having a preselected maximum (convenient) integer constant value (e.g., 4, 8, 16, 32, etc.) at which value the determination is terminated, the residual is scaled and accumulated, and the determination is started again. Physically, the maximum value of S represents the largest integer secant commensurate with the accumulated values of P and Q. $S_c$ is, however, the actual "correct" (non-integer) value obtained from the inputs P and Q. The residue R represents a partial pulse which must not be ignored or thrown away. To address this issue, consider the following:

$$S_c = S + [1 + R/S^2]^{\frac{1}{2}}. \quad [14]$$

The square root can be expanded using the Binomial series and then can be simplified to:

$$S_c = S + [R/2S] - [R^2/8S^3] + [R^3/16S^5] - [5R^4/128S^7] + \ldots \quad [15]$$

This expression is a convergent series having alternate terms of opposite sign. Therefore, it oscillates about and converges toward the final value. The expression, of course, is too complicated to evaluate quickly with a small microprocessor, but an approximate value may be obtained by using a limited number of terms. The approximation error will be less than the absolute value of the first neglected term, and it may be observed that this (error) value will be smaller for large values of a maximum S value. Large values of a maximum S value, however, represent longer secants which are less accurate representations of a curvilinear function. The first two terms overestimate the actual result but a close approximation may be obtained by using a small value of a maximum S value (such as 16) and modifying the second term to obtain:

$$S_c = S + [2R/(4S+1)]. \quad [16]$$

At the termination point, the value 2R is added to a register to represent the partial pulse remaining at that time, the other registers are reset, and the computation is restarted. At the next reset point, the value 2R is again added to the register and the total is compared to 4S+1. If an overflow occurs, an additional "makeup" pulse is generated and 4S+1 is subtracted from the register.

An alternative method having higher accuracy may be used if the reset value for S is chosen to be some small number such as 8, 16 or 32. In this approach, the value of R is used as an index to a look-up table in which the true values of the expression $[(S^2+R)^{\frac{1}{2}} - S]$ are stored. These decimal fractions are multiplied by $2^{16}$ and stored as two byte integers for high accuracy.

At the termination points, the two byte integers are added to a register and a makeup pulse is generated when the register overflows. Using either alternative technique, the partial pulses are correctly accounted for, but the pulses occur slightly later in time.

Choosing the value of S at which to terminate computation and reset the registers involves some trade-offs. If the value of S at termination is made larger, the proportion of pulses delayed in time is made smaller, but the secant departs more from the true kVAh curve if the power factor is varying. The look-up table also becomes larger therefore requiring more memory. If the maximum value of S is selected to be small, then the possible values of R are limited. Since termination occurs more often with smaller maximum S values, however, more processing (e.g., determination of R and reset) is required. Suitable values for the maximum value of S have been found to be in the range of 10 to 50.

The generated S pulses can be accumulated in demand or in time-of-use registers, over fixed or rolling demand intervals, in conventional fashion. The algorithm is not interrupted at the end of an interval or at any other time except for a watch-dog function to initialize the algorithm in the event of a computer malfunction.

Each termination of the computation at the selected value of S is associated with some specific integer values of P and Q. For power factors greater than 0.707, P is greater than Q. For power factors less than 0.707, Q is greater than P but the values of P and Q have mirror image symmetry about the 45 degrees axis.

The value of Q or P at the termination point can be used as an index to another look-up table in which are stored the values of the power factor associated with each unique value of Q or P. By this means, near real time display of power factor may be obtained. Alternatively, the "average" power factor for the most recent demand interval may be determined from the values of P and S at the end of the interval. The algorithm has been extensively tested with pulse input trains representing randomly varying power factors for random periods of time.

The present algorithm also has utility for use with Qhour meters. A Qhour meter is a variation of the VARhour meter. In a Qh meter, the voltage applied to the meter is delayed or lags 60 degrees behind the normal phase voltage instead of 90 degrees as in the VARh meter. Two advantages result from this approach. First, the 60 degrees lagging voltage can be obtained from the other phasors in a three phase system without using phase shifting transformers. Second, the meter will operate in a forward direction for load phase angles up to 30 degrees leading. A VARh meter, in contrast, reverses direction for all leading phase angles.

The symbol Q is an electrical industry standard to represent reactive power, kVAR. It is also widely used in the utility metering industry to name a meter operating with a 60 degrees lagged voltage as described above. To avoid confusion in describing the operation of the algorithm as applied to Qh metering, the following symbols will be used:
V = VARh;
W = Wh;
VA = VAh; and
Q = Standard "Qh" at 60 degrees lag angle.

It is well known that for Qh meter operation, the following equations hold:

$$V = [2Q - W]/3^{1/2};  \quad [17]$$

$$V^2 = [2Q - W]^2/3 = [4Q^2 - 4QW + W^2]/3; \text{ and} \quad [18]$$

$$3V^2 = 4Q^2 - 4QW + W^2. \quad [19]$$

Further:

$$S = [V^2 + W^2]^{1/2}; \text{ and} \quad [20]$$

$$S^2 = V^2 + W^2. \quad [21]$$

Therefore:

$$\begin{aligned} 3S^2 &= 3V^2 + 3W^2; & [22]\\ &= 4Q^2 - 4QW + W^2 + 3W^2; & [23]\\ &= 4Q^2 - 4QW + 4W^2; \text{ and} & [24]\\ &= 4[Q^2 - QW + W^2] & [25] \end{aligned}$$

If S, Q, and W all have integer values, it is once again necessary to introduce an integer residue R to permit equation 25 to be an equality. Particularly:

$$R = [4Q^2 - 4QW + 4W^2 - 3S^2] \quad [26]$$

The problem then becomes: given Q and W, determine S and R.

In operation, the W, Q, S and R registers would be initialized to zero. The $(2Q+1)$, $(2W+1)$ and $(2S+1)$ registers would be initialized to one. Upon receipt of a W input pulse from the metering means, the following steps would be performed:
(1) add $4*(2W+1)$ to the R register;
(2) subtract $(4*Q)$ from the R register;
(3) increment the W register by one;
(4) increment the $(2W+1)$ register by two; and
(5) check for S output pulse.

Upon receipt of a Q pulse from the metering means, the following steps would be performed:
(1) add $4*(2Q+1)$ to the R register;
(2) subtract $(4*W)$ from the R register;
(3) increment the Q register by one;
(4) increment the $(2Q+1)$ register by two; and
(5) check for S output pulse.

To check whether to output a S output pulse, the following steps are performed:
(1) compare $3*(2S+1)$ to the value of the R register;
(2) if greater than the R register, do nothing and wait for another input pulse from the metering means;
(3) if less than or equal to R register, then subtract $3*(2S+1)$ from the R register, increment the S register by one, increment the $(2S+1)$ register by two, and output an S output pulse.

As described earlier for the VARh case, it is necessary to select a value of S at which to terminate the determination and reset. The same factors need to be considered and the same range of values (10 to 50) for S are believed to be suitable.

To allow for the partial pulse represented by the value of the residual R at the termination point, the simplest procedure is to use R as an index to a look-up table. In this instance, the values in the table are obtained from the expression:

$$\{[4(Q^2 - QW + W^2)/3]^{1/2} - S\} \quad [27]$$

The decimal fraction is multiplied by $2^{16}$ and stored as a two byte integer. At each termination point, the two byte integer is added to a register and a make-up pulse is generated when the register overflows.

Each termination of the computation at the selected value of S is associated with some specific integer values of W and Q. At a lagging power factor of 0.866, W is equal to Q. For lagging power factors less than 0.866, W is less than Q. For lagging power factor greater than 0.866 up to 1.0 and beyond, to a leading power factor of 0.866, W is greater than Q. The values of W and Q can therefore be used as indices to a look-up table in which are stored the values of power factor associated with each unique value of W and Q.

While the present invention has been described with respect to specific embodiments, many modifications, variations, substitutions, and equivalents will be apparent to those skilled in the art. Accordingly, the invention is to be considered as limited only by the spirit and scope of the appended claims.

What is claimed is:

1. A method of operating a meter coupled between an end user and a power delivery system, the meter comprising metering means and processing means, the processing means comprising register means for storing values of P, $(2P-1)$, Q $(2Q-1)$, R, S and $(2S-1)$ where P = real energy, Q = reactive energy, S = apparent energy and R = remainder, said method comprising the steps of:

outputting, from the metering means, and upon each occurrence of the end user consuming a predetermined quantum of real energy, a pulse representative of the predetermined quantum of real energy, which pulse is provided to the processing means, and upon receipt of each real energy pulse by the processing means, controlling the processing means to perform the steps of:
incrementing the (2P−1) register means by two;
adding the value of the (2P−1) register means to the R register means; and
incrementing the P register means by one;
outputting, from the metering means, and upon each occurrence of the end user consuming a predetermined quantum of reactive energy, a pulse representative of the predetermined quantum of reactive energy, which pulse is provided to the processing means, and upon receipt of each reactive energy pulse by the processing means, controlling the processing means to perform the steps of:
incrementing the (2Q−1) register means by two;
adding the value of the (2Q−1) register means to the R register means; and
incrementing the Q register means by one;
generating, in the processing means, and from values stored in the register means, a measure of apparent energy.

2. A method in accordance with claim 1 wherein the P, Q, R and S registers are initially set to zero and the (2P−1), (2Q−1) and (2S−1) registers are initially set to negative 1.

3. A method in accordance with claim 1 wherein when the value of the S register means reaches a predetermined value, the values then in the respective register means are stored and then the P, Q, R, S, (2P−1), (2Q−1) and (2S−1) register means are reset.

4. A method in accordance with claim 3 further comprising register means for storing values equal to 2R and (4S+1) and upon resetting the P, Q, R, S, (2P−1), (2Q−1) and (2S−1) register means, said method further comprises the steps of:
adding the current value of 2R to the 2R register means;
subtracting (4S+1) from the total stored in the 2R register means; and
if the subtraction results in a positive number, incrementing the S register by one.

5. A method in accordance with claim 3 further comprising lookup table means having S and R values for the expression $[(S^2+R)^{\frac{1}{2}}-S]$ stored therein and wherein upon resetting the register means, the current value of R is used to locate the associated predetermined fraction for S stored in the lookup table means and the fraction is then stored in a predesignated register for determining whether the S register should be incremented.

6. A method in accordance with claim 1 further comprising the step of:
determining power factor from the values stored in at least two of the register means.

7. A method in accordance with claim 1 wherein generation of a measure of apparent energy comprises the steps of:
subtracting the value of the (2S−1) register means from the value of the R register means, and if the subtraction results in a positive number, then performing the steps of:
incrementing the (2S−1) register means by two;
decrementing the R register means by (2S−1); and
incrementing the S register means by one.

8. Apparatus for determining apparent energy consumed by an end user coupled to a power delivery system providing such energy to the end user, said apparatus comprising:
metering means for coupling between the end user and the power delivery system, said metering means being configured to generate, each time a predetermined quantum of real and reactive energy has been consumed from the power delivery system by the end user, a real energy pulse representative of the predetermined quantum of real energy consumed by the end user and a reactive energy pulse representative of the predetermined quantum of reactive energy consumed by the end user, respectively;
processing means coupled to said metering means for receiving the real energy pulses and the reactive energy pulses output therefrom, said processing means further comprising register means for storing values of P, (2P−1) Q, (2Q−1), R, S and (2S−1) where P=real energy, Q=reactive energy, S=apparent energy and R=remainder, said processing means being controlled to perform the steps of:
upon receipt of a real energy pulse from said metering means, performing the steps of:
incrementing said (2P−1) register means by two;
adding the value of said (2P−1) register means to said R register means; and
incrementing said P register means by one;
upon receipt of the reactive energy pulse from said metering means, performing the steps of:
incrementing said (2Q−1) register means by two;
adding the value of said (2Q−1) register means to said R register means; and
incrementing said Q register means by one;
generating, from values stored in said register means, a measure of apparent energy.

9. Apparatus in accordance with claim 8 wherein said P, Q, R and S register means are initially set to zero and said (2P−1), (2Q−1) and (2S−1) register means are initially set to negative one.

10. Apparatus in accordance with claim 8 further comprising means for resetting said register means when the value of S reaches a predetermined value and means for determining whether to increment said S register mean by one upon resetting said register means.

11. Apparatus in accordance with claim 8 further comprising:
means for determining power factor.

12. A method of operating a meter coupled between an end user and a power delivery system, the meter comprising metering means and processing means, the processing means comprising register means for storing values of W, Q, S, R, (2Q+1), (2W+1) and (2S+1), where W=watthours, Q=Qhours, S=apparent energy and R=remainder, said method comprising the steps of:
outputting, from the metering means, and upon each occurrence of the end user consuming a predetermined quantum of real energy, a pulse representative of the predetermined quantum of real energy, which pulse is provided to the processing means, and upon receipt of each real energy pulse by the processing means, controlling the processing means to perform the steps of:
adding 4*(2W−1) to the R register means;
subtracting (4*Q) from the R register means;
incrementing the W register means by one; and
incrementing the (2W+1) register means by two;
outputting, from the metering means, and upon each occurrence of the end user consuming a predetermined quantum of Q energy, a pulse representative of the predetermined quantum of Q energy, which pulse is provided to the processing means, and upon receipt of each Q energy pulse by the processing means, controlling the processing means to perform the steps of:
- adding 4*(2 Q+1) to the R register means;
- subtracting (4*W) from the R register means;
- incrementing the Q register means by one; and
- incrementing the (2Q+1) register means by two;

generating, in the processing means, and from values stored in the register means, a measure of apparent energy.

13. A method in accordance with claim 12 wherein the real energy and the Qhour energy measures are integer quantities.

14. A method in accordance with claim 12 wherein the real, Qhour, and apparent energy are related by:

$$R = [4Q^2 - 4QW - 3S^2],$$

where:
S = apparent energy;
R = residue;
W = real energy; and
Q = standard "Qh" at 60 degrees lag angle.

15. A method in accordance with claim 12 wherein the W, Q, S and R register means are initialized to zero and the (2Q+1), (2W+1) and (2S+1) register means are initialized to one.

16. A method in accordance with claim 15 wherein upon receipt of a W pulse, the following steps are performed:
- adding 4*(2W+1) to the R register means;
- subtracting (4*Q) from the R register means;
- incrementing the W register means by one; and
- incrementing the (2Q+1) register means by two; and
- checking for an S output pulse.

17. A method in accordance with claim 15 wherein generating a measure of apparent energy comprises the steps of:
- comparing 3*(2S−1) to the value of the R register means;
- if 3*(2S−1) is greater than the value stored in the R register means, doing nothing and waiting for another input pulse from metering means;
- if 3*(2S−1) is less than or equal to the value stored in the R register means, then subtracting 3*(2S+1) from the R register means, incrementing the S register by one, incrementing the (2S+1) register means by two, and outputting an S output pulse.

18. A method in accordance with claim 15 wherein the value in the R register means is used as an index in a look-up table to determine whether the remainder requires that a make-up pulse be generated.

19. A method in accordance with claim 15 wherein the values of W and Q are utilized as indices to a look-up table in which values of power factor are stored.

20. A method of operating a meter coupled between an end user and a power delivery system, the meter comprising metering means and processing means, the processing means comprising register means for storing values of W, Q, S, R, (2Q−1), (2W−1) and (2S−1), where W = watthours, Q = Qhours, S = apparent energy and R = remainder, said method comprising the steps of:

outputting, from the metering means, and upon each occurrence of the end user consuming a predetermined quantum of real energy, a pulse representative of the predetermined quantum of real energy, which pulse is provided to the processing means, and upon receipt of each real energy pulse by the processing means, controlling the processing means to perform the steps of:
- incrementing the W register means by one;
- incrementing the (2W−1) register means by two;
- adding 4*(2W−1) to the R register means; and
- subtracting (4*Q) from the R register means;

outputting, from the metering means, and upon each occurrence of the end user consuming a predetermined quantum of Q energy, a pulse representative of the predetermined quantum of Q energy, which pulse is provided to the processing means, and upon receipt of each Q energy pulse by the processing means, controlling the processing means to perform the steps of:
- incrementing the Q register means by one;
- incrementing the (2Q−1) register means by two;
- adding 4*(2Q−1) to the R register means; and
- subtracting (4*W) from the R register means.

21. A method in accordance with claim 20 wherein the W, Q, S and R register means are initialized to zero and the (2Q−1), (2W−1) and (2S−1) register means are initialized to negative one.

22. A method in accordance with claim 21 wherein generating a measure of apparent energy comprises the steps of:
(a) incrementing the S register means by one;
(b) incrementing the [2S−1] register means by two;
(c) subsequent of generation of a W or Q pulse, subtracting three times the value of the [2S−1] register means from the value of the R register means;
(d) if the subtraction in step (c) does not cause an underflow, then:
 (i) generating an S pulse;
(e) if the subtraction in step (c) causes an underflow, then:
 (i) resetting the R register means to its previous value;
 (ii) resetting the S register means to its previous value;
 (iii) resetting the [2S−1] register means to its previous value; and
 (iv) not generating an S pulse.

23. A method in accordance with claim 20 wherein the value in the R register means is used as an index in a look-up table to determine whether the remainder requires that a make-up pulse be generated.

24. A method in accordance with claim 20 wherein the values of W and Q are utilized as indices to a look-up table in which values of power factor are stored.

25. A method of operating a meter coupled between an end user and a power delivery system, the meter comprising meting means and processing means, the processing means comprising register means for storing values of P, (2P+1), (2Q+1), R, S and (2S+1) where P = real energy, Q = reactive energy, S = apparent energy and R = remainder, said method comprising the steps of:

outputting, from the metering means, and upon each occurrence of the end user consuming a predetermined quantum of real energy, a pulse representative of the predetermined quantum of real energy, which pulse is provided to the processing means, and upon receipt of each real energy pulse by the processing means, controlling the processing means to perform the steps of:

adding the value of the (2P+1) register means to the R register means;
incrementing the P register means by one; and
incrementing the (2P−1) register means by two;
outputting, from the metering means, and upon each occurrence of the end user consuming a predetermined quantum of reactive energy, a pulse representative of the predetermined quantum of reactive energy, which pulse is provided to the processing means, and upon receipt of each reactive energy pulse by the processing means, controlling the processing means to perform the steps of:
adding the value of the (2Q+1) register means to the R register means;
incrementing the Q register means by one;
incrementing the (2Q−1) register means by two; and
generating, in the processing means, and from values stored in the register means, a measure of apparent energy, generation of the measure of apparent energy comprising the steps of:
subtracting the value of the (2S−1) register means from the value of the R register means, and if the subtraction results in a positive number, then performing the steps of:
decrementing the R register means by (2S+1);
incrementing the S register means by one; and
incrementing the (2S+1) register means by two.

26. A method in accordance with claim 25 wherein the P, Q, R and S registers are initially set to zero and the (2P+1), (2Q+1) and (2S+1) registers are initially set to positive 1.

27. A method in accordance with claim 25 wherein when the value of the S register means reaches a predetermined value, the values then in the respective register means are stored and then the P, Q, R, S, (2P+1), (2Q+1) and (2S+1) register means are reset.

28. A method in accordance with claim 27 further comprising register means for storing values equal to 2R and (4S+1), and upon resetting the P, Q, R, S, (2P+1), (2Q+1) and (2S+1) register means, said method further comprises the steps of:
adding the current value of 2R to the 2R register means;
subtracting (4S+1) from the total stored in the 2R register means; and
if the subtraction results in a positive number, incrementing the S register by one.

29. A method in accordance with claim 27 further comprising lookup table means having S and R values for the expression $[(S^2+R)^{\frac{1}{2}}-S]$ stored therein and wherein upon resetting the register means, the current value of R is used to locate the associated predetermined fraction for S stored in the lookup table means and the fraction is then stored in a predesignated register for determining whether the S register should be incremented.

30. A method in accordance with claim 25 further comprising the step of:
determining power factor from the values stored in at least two of the register means.

31. Apparatus for determining apparent energy consumed by an end user coupled to a power delivery system providing such energy to the end user, said apparatus comprising:
metering means for coupling between the end user and the power delivery system, said metering means being configured to generate, each time a predetermined quantum of real and reactive energy has been consumed from the power delivery system by the end user, a real energy pulse representative of the predetermined quantum of real energy consumed by the end user and a reactive energy pulse representative of the predetermined quantum of reactive energy consumed by the end user, respectively;
processing means coupled to said metering means for receiving the real energy pulses and the reactive energy pulses output therefrom, said processing means further comprising register means for storing values of P, (2P+1), Q, (2Q+1), R, S and (2S+1) where P=real energy, Q=reactive energy, S=apparent energy and R=remainder, said processing means being controlled to perform the steps of:
upon receipt of a real energy pulse from said metering means, performing the steps of:
adding the value of said (2P+1) register means to said R register means;
incrementing said P register by one; and
incrementing said (2P+1) register means by two;
upon receipt of the reactive energy pulse from said metering means, performing the steps of:
adding the value of said (2Q+1) register means to said R register means;
incrementing said Q register by one; and
incrementing said (2Q+1) register means by two;
generating, from values stored in said register means, a measure of apparent energy, generation of the measure of apparent energy comprising the steps of:
subtracting the value of the (2S−1) register means from the value of the R register means, and if the subtraction results in a positive number, then performing the steps of:
decrementing the R register means by (2S+1);
incrementing the S register means by one; and
incrementing the (2S+1) register means by two.

32. Apparatus in accordance with claim 31 wherein said P, Q, R and S register means are initially set to zero and said (2P+1), (2Q+1) and (2S+1) register means are initially set to positive one.

33. Apparatus in accordance with claim 31 further comprising means for determining whether to increment said S register means by one upon resetting said register means.

34. Apparatus in accordance with claim 31 further comprising means for determining power factor.

* * * * *

UNITED STATES PATENT AND TRADEMARK OFFICE
CERTIFICATE OF CORRECTION

PATENT NO. : 5,229,713
DATED : July 20, 1993
INVENTOR(S) : Bullock et al.

It is certified that error appears in the above-identified patent and that said Letters Patent is hereby corrected as shown below:

TITLE PAGE:

"U.S. PATENT DOCUMENTS" (second occurrence) should be --OTHER PUBLICATIONS--.

Column 4, line 43, "S TMkVAh" should be --S =kVAh--.

Column 4, line 45, "(2Q+1]," should be --[2Q+1],--.

Column 4, line 46, delete "of".

Column 13, Equation [13], after "=" (first occurrence) insert --[--.

Column 14, Equation [16], "[16]" should be moved to the right margin to indicate equation numeral.

Column 15, Equation [20]: "$S=[V^2+W2]^{1/2}; and$" should be --$S=[V^2+W^2]^{1/2}; and$--.

Column 16, line 59, after "Q" insert --,--.

UNITED STATES PATENT AND TRADEMARK OFFICE
CERTIFICATE OF CORRECTION

PATENT NO. : 5,229,713
DATED : July 20, 1993
INVENTOR(S) : Bullock et al.

It is certified that error appears in the above-identified patent and that said Letters Patent is hereby corrected as shown below:

Column 18, line 43, "mean" should be --means--.

Column 19, line 34, delete "and".

Column 19, line 35, "(2Q+1)" should be --(2W+1)--.

Column 20, line 30, "of" (first occurrence) should be --to--.

Column 20, line 57, after "(2P+1)," insert -- Q, --.

Column 22, line 31, after "register" insert --means--.

Column 22, line 37, after "register" insert --means--.

Signed and Sealed this

Twelfth Day of July, 1994

Attest:

*Attesting Officer*

BRUCE LEHMAN

*Commissioner of Patents and Trademarks*